United States Patent
Tabarani et al.

(10) Patent No.: US 12,052,024 B2
(45) Date of Patent: Jul. 30, 2024

(54) DIGITAL-TO-ANALOG CONVERTER WITH HYBRID COUPLER

(71) Applicant: Apple Inc., Cupertino, CA (US)

(72) Inventors: Filipe Tabarani, Hohenlinden (DE); Timo W Gossmann, Neubiberg (DE)

(73) Assignee: Apple Inc., Cupertino, CA (US)

( * ) Notice: Subject to any disclaimer, the term of this patent is extended or adjusted under 35 U.S.C. 154(b) by 91 days.

(21) Appl. No.: 17/871,683

(22) Filed: Jul. 22, 2022

(65) Prior Publication Data

US 2024/0030929 A1 Jan. 25, 2024

(51) Int. Cl.
 *H03M 1/74* (2006.01)
 *H03M 1/00* (2006.01)
 *H03M 1/06* (2006.01)
 *H04L 27/20* (2006.01)
 *H04L 27/36* (2006.01)
 *H03M 1/66* (2006.01)

(52) U.S. Cl.
 CPC ......... *H03M 1/002* (2013.01); *H03M 1/0648* (2013.01); *H04L 27/206* (2013.01); *H04L 27/362* (2013.01); *H03M 1/66* (2013.01)

(58) Field of Classification Search
 CPC ...... H03M 1/002; H03M 1/0648; H03M 1/66; H04L 27/206; H04L 27/362
 See application file for complete search history.

(56) References Cited

U.S. PATENT DOCUMENTS

| | | | |
|---|---|---|---|
| 7,460,612 B2 | 12/2008 | Eliezer et al. | |
| 7,812,775 B2 | 10/2010 | Babkhani et al. | |
| 9,031,163 B2 | 5/2015 | Matsuo et al. | |
| 9,184,974 B1 | 11/2015 | Baringer et al. | |
| 9,571,120 B2 | 2/2017 | Kuttner et al. | |
| 10,491,303 B2 | 11/2019 | Ashrafi | |
| 11,303,347 B1* | 4/2022 | Bendlin | H01Q 21/08 |
| 2004/0057533 A1 | 3/2004 | Kermalli | |

OTHER PUBLICATIONS

Tabarani et al., "Compact Monolithic Spiral Quadrature Coupler Design" IEEE, Institute of Electron Devices and Circuits, Ulm University 89081 Ulm, Germany, PRIME 2017, Radio Frequency Circuits and Systems II.

Yoo et al., "A Switched-Capacitor RF Power Amplifier," IEEE Journal of Solid-State Circuits, vol. 46, No. 12, Dec. 2011.

Grebennikov, "Power Combiners, Impedance Transformers and Directional Couplers: Part III," Feb. 2008 High Frequency Electronics.

* cited by examiner

*Primary Examiner* — Joseph J Lauture
(74) *Attorney, Agent, or Firm* — FLETCHER YODER PC

(57) ABSTRACT

The current disclosure is related to a column and line digital-to-analog converter (DAC) with a hybrid coupler for generating quadrature analog signals. The DAC may include an array of unit power amplifiers (cells). A first portion of the cells of the array may be coupled to a first column decoder to receive in-phase components of digital signals and a second portion of the cells may be coupled to a second column decoder to receive quadrature components of the digital signals. The first portion of the cells of the array may generate in-phase components of analog signals and the second portion of the cells of the array may generate quadrature components of the analog signals. A hybrid coupler of the DAC may receive the in-phase and quadrature components of the analog signals with a similar phase, delay the quadrature components by a phase delay (e.g., 90 degrees), and output the resulting analog signals.

20 Claims, 6 Drawing Sheets

DIGITAL-TO-ANALOG CONVERTER WITH HYBRID COUPLER

BACKGROUND

This disclosure generally relates to digital-to-analog converters (DACs) and order of enablement of unit cells of the DACs.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. In some embodiments, a DACs may include different circuitry for generating the analog signals with different frequencies.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a digital-to-analog converter (DAC) is described. The DAC may include a radio frequency DAC (RFDAC) that generates RF (or intermediate frequency) signals, as opposed to baseband signals. The DAC may include a first cell, a second cell, a clock signal line, an in-phase digital code line, a quadrature digital code line, and decoder circuitry coupled to the first cell, the second cell, the clock signal line, and the in-phase digital code line. The DAC may also include a first matching circuit coupled to the first cell, a second matching circuit coupled to the second cell, and a hybrid coupler coupled to the first matching circuit and the second matching circuit. In some embodiments, only a single clock line is needed to generate in-phase and quadrature component based on the in-phase digital code line and the quadrature digital code line.

In another embodiment, a transmitter is described. The transmitter may include a power amplifier and a digital-to-analog converter (DAC) coupled to the power amplifier. The DAC may include a clock signal line, an in-phase digital code line, a quadrature digital code line, and a first column decoder coupled to the clock signal line, the in-phase digital code line, and a first cell. The first cell may output a first output signal. The DAC may also include a second column decoder coupled to the clock signal line, the quadrature digital code line, and a second cell. The second cell may output a second output signal. The DAC may further include a line decoder coupled to the clock signal line, the quadrature digital code line, the first cell, and the second cell. The DAC may also include a hybrid that may receive the first output signal and the second output signal, and output a quadrature analog signal to the power amplifier based on the first output signal and the second output signal.

In yet another embodiment, an electronic device is described. The electronic device may include one or more antennas, a memory storing digital codes, and a processor that may provide the digital codes retrieved from the memory based on receiving an indication to transmit data. The electronic device may also include a digital-to-analog converter (DAC) having a hybrid coupler. The DAC may receive the digital codes from the processor, and the hybrid coupler may receive a first signal having a first phase based on the digital codes, output the first signal having the first phase for transmission by the one or more antennas, and receive a second signal having the first phase based on the digital codes. The DAC may also delay the second signal to generate a delayed second signal having a second phase, and output the delayed second signal for transmission by the one or more antennas.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
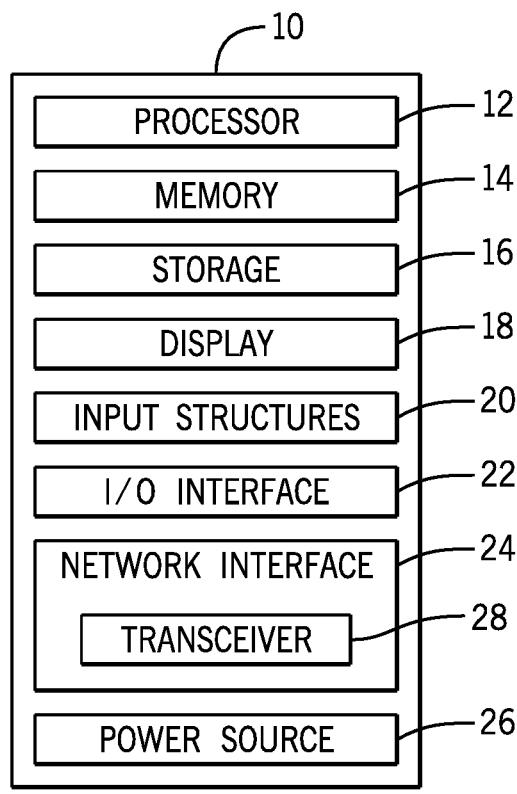
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The current disclosure is related to digital-to-analog converters (DACs) for high frequency applications. For example, the DACs may include column-and-line DACs, column-only DACs, and so on. In some embodiments, an electronic device may include such DACs to generate radio frequency (RF) signals at cellular and/or millimeter wave (mmWave) frequency range (e.g., above 0.5 gigahertz (GHz), above 1 GHz, above 5 GHz, above 15 GHz, above 30 GHz, and so on). For example, the electronic device may include one or more antennas to transmit the RF signals generated by the column and line DACs described herein.

In particular, a column and line DAC may receive digital code (e.g., coded via binary code, grey-code, thermometer code, etc.) for generating a RF signal. The DAC may receive an in-phase digital code (I digital code) for generating an in-phase signal (I signal) and a quadrature digital code (Q digital code) for generating a quadrature signal (Q signal) of the RF signal. The present disclosure enables the DAC may receive a clock signal (e.g., a single clock signal) to generate the I signal and the Q signal (e.g., two different clock signals in quadrature).

The DAC may include an array of unit power amplifiers. The unit power amplifiers may generate a number of unit power signals indicative of the I signal and/or the Q signal based on the clock signal and upon receiving the I digital code and/or the Q digital code. For example, each unit power amplifier may generate a unit power signal based on a supply voltage level, a respective voltage gain, or both. Moreover, the DAC may include a first matching circuit and a second matching circuit to combine (e.g., aggregate) the unit power signals to provide the I signal and the Q signal, respectively. Accordingly, the DAC may generate the I signal in-phase with the Q signal based on receiving the single clock signal.

Moreover, the DAC may include a coupler (e.g., a 90 degree hybrid coupler) to provide a 90 degree phase shift to the Q signal. For example, a first input port of the coupler may receive the I signal and a second input port of the coupler may receive the Q signal. As such, the coupler may provide the Q signal with 90 degrees (e.g., near 90 degrees) phase delay to provide quadrature signals to other circuits of the electronic device. For example, the coupler may provide the I signal and the Q signal with 90 degrees phase difference to the antennas for transmission.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11×family of protocols (e.g., WI-FIC), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 GHz) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
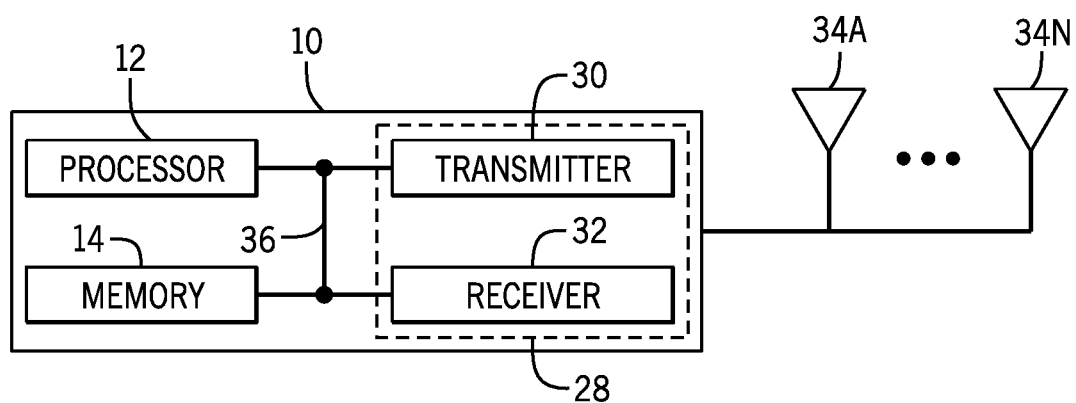
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each of the antennas 34A-34N may be associated with one or more beams and various configurations. In some embodiments, multiple antennas of the antennas 34A-34N of an antenna group or module may be communicatively coupled to a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
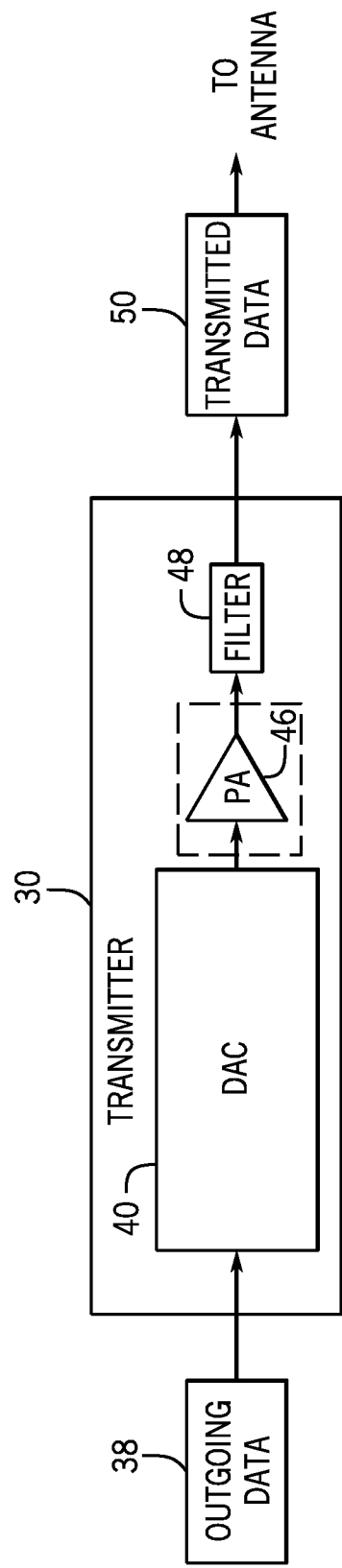
FIG. 3 is a block diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the antennas 34A-34N. A digital-to-analog converter (DAC) 40 of the transmitter 30 may convert the digital signal to an analog signal combined with a carrier signal to generate a radio wave. The DAC 40 may include a radio frequency DAC (RFDAC) that generates RF (or intermediate frequency) signals, as opposed to baseband signals. The RF signals may then be converted to mmWave signals, if desired. As such, a modulator 42 may not be needed to combine the analog signal with a carrier signal, as the DAC may already perform this step. The analog signal may include quadrature analog signals (I/Q signals) including an in-phase component and a quadrature component. Additionally, while embodiments are described herein as applying to RF signal generation, in some embodiments, aspects of the present disclosure may be applicable to other types or utilizations of DACs, such as a baseband DAC.

An optional power amplifier (PA) 46 may receive the modulated signal from the modulator 42. The power amplifier 46 may amplify the modulated signal to a suitable level to drive transmission of the signal via the antennas 34A-34N. The power amplifier 46 may be optional depending on output power requirements. A filter 48 (e.g., filter circuitry and/or software) of the transmitter 30 may then remove undesirable noise from the signal to generate transmitted data 50 to be transmitted via the antennas 34A-34N. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components that are not shown, or may not include certain of the illustrated components, such that the transmitter 30 may transmit the outgoing data 38 via the antennas 34A-34N. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
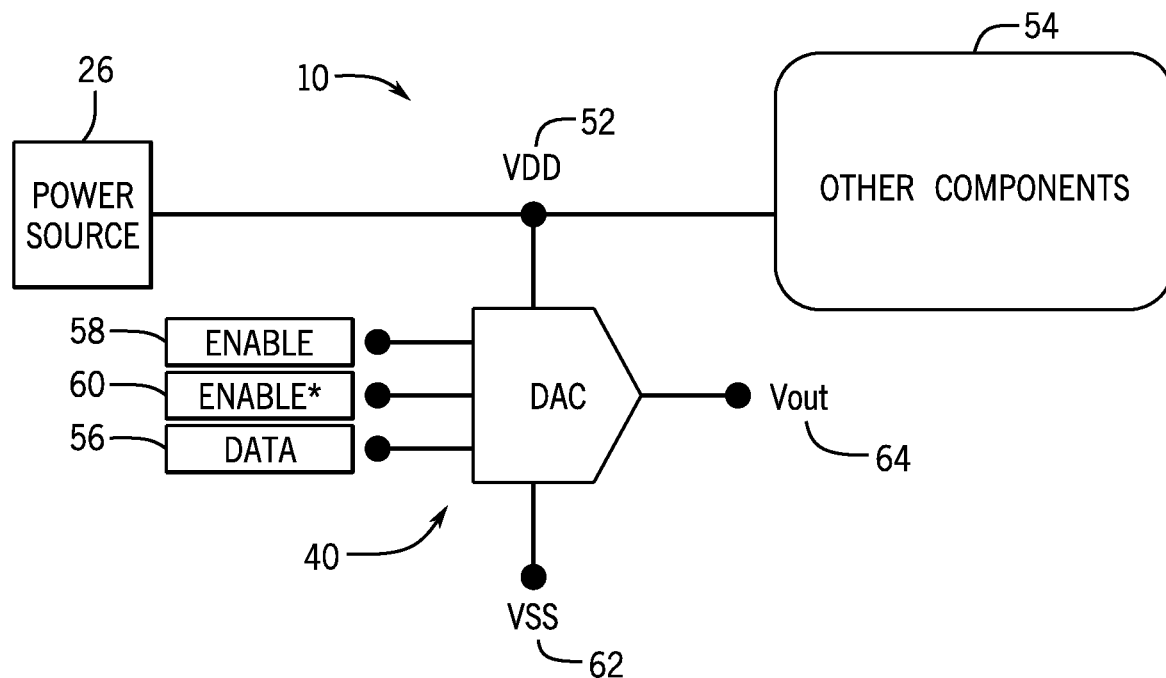
FIG. 4 is a block diagram of a portion of the electronic device of FIG. 1 including a digital-to-analog converter of the transmitter of FIG. 3, in accordance with an embodiment of the present disclosure.

FIG. 4 is a schematic diagram of a portion of the transmitter 30 of the electronic device 10 having the DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive a digital signal 56 (e.g., of outgoing data 38), an enable signal 58, and/or a complementary enable signal 60. In some cases, the digital signal 56 may include in-phase digital code and quadrature digital code. For example, the DAC 40 may include decoder circuitry (e.g., an in-phase column decoder, a quadrature column decoder, and a line decoder) to receive and convey the digital signal 56 to one or more cells of the DAC 40. Moreover, the in-phase digital code may be associated with generating an in-phase component of a RF signal and the quadrature digital code may be associated with generating a quadrature component of the RF signal, as will be appreciated.

The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RFDAC), an 8-bit digital signal 56 may correspond to 255 or 256 analog output signals 64.

Figure 5:
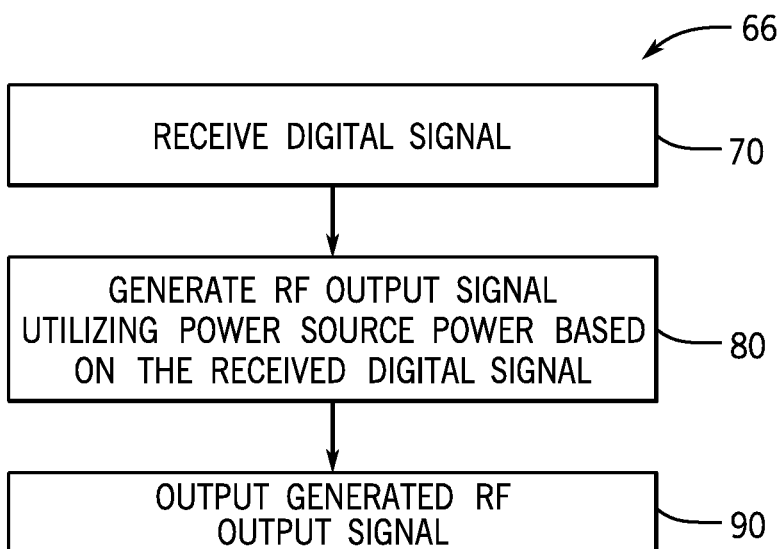
FIG. 5 is a flowchart of a method for converting a digital signal to a radio frequency (RF) signal (e.g., a millimeter wave (mmWave) signal) using the digital-to-analog converter (DAC) of FIG. 4, in accordance with an embodiment of the present disclosure.

FIG. 5 is a flowchart of a method 66 for converting a digital signal to a RF signal (e.g., an mmWave signal) using the DAC 40, according to an embodiment of the present disclosure. In general, the DAC 40 may receive a digital signal 56 (process block 70). The DAC 40 may also generate an RF (e.g., mmWave) output signal 64 (as discussed in further detail below), utilizing power from the power source 26, based on the received digital signal 56 (process block 80). The generated RF output signal 64 may then be output from the DAC 40 (processing block 90).

As discussed above, the DAC 40 may generate an RF output signal 64 by enabling one or more unit cells to output a unit amount of current or voltage that, in the aggregate, form the analog output signal 64. The unit current or voltage may be predetermined and based on implementation factors. For example, the unit cells may include one or more capacitors that store a fixed amount of charge that may be released to form the analog output signal 64.

Figure 6:
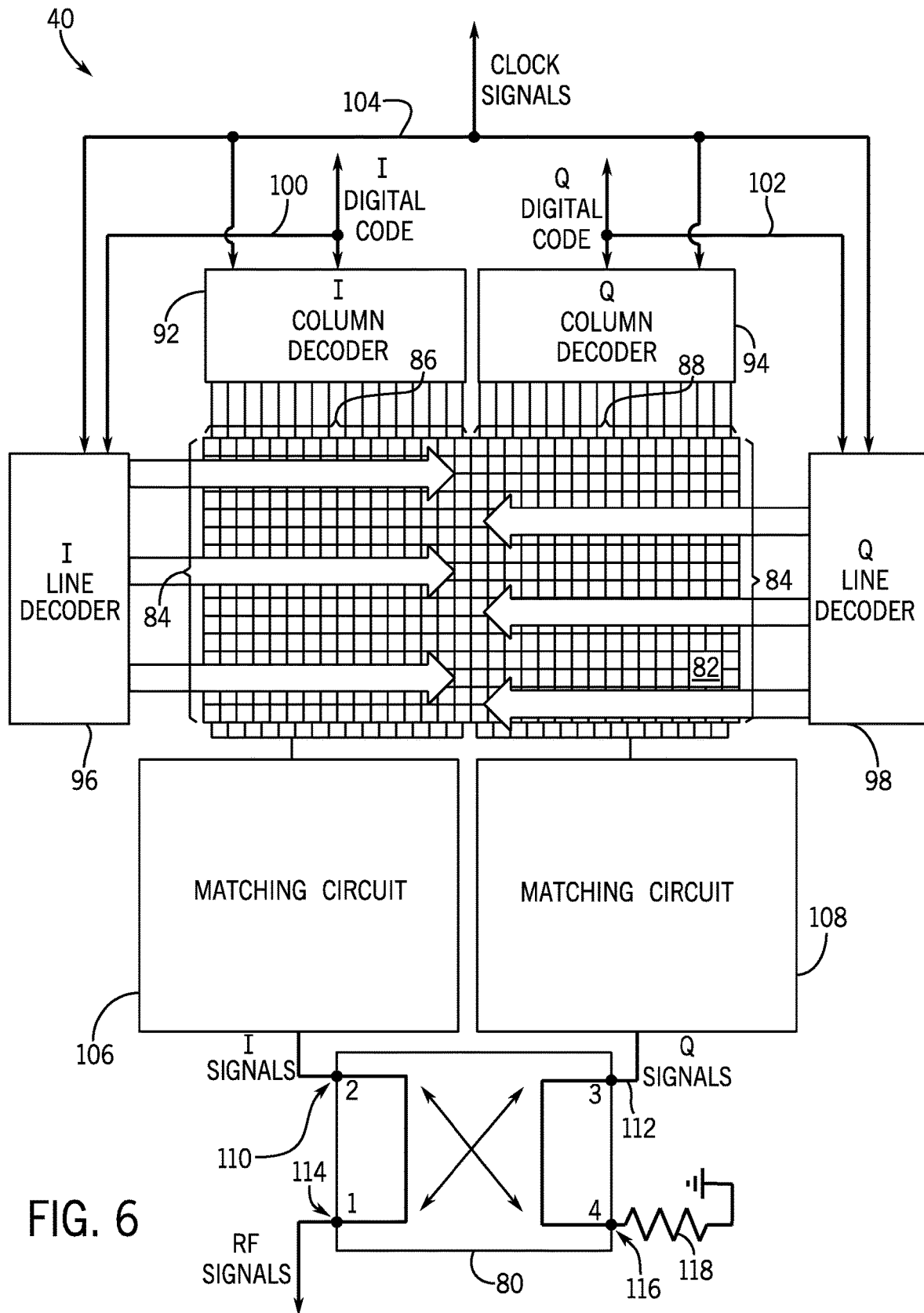
FIG. 6 is a circuit diagram of the DAC of FIGS. 3 and 4 including a hybrid coupler, in accordance with an embodiment of the present disclosure.

FIG. 6 depicts a column and line DAC 40 including a 90 degree hybrid coupler 80 to provide analog signals (e.g., RF signals) including in-phase signals (I signals) and quadrature signals (Q signals) for transmission. In the depicted embodiment, multiple unit power amplifiers 82, hereinafter cells 82, are arranged in lines 84 and first and second groups or sets of columns 86 and 88 of an array 90. In some embodiments, each cell 82 may include one or more capacitors to generate a unit powered signal upon activation. In additional or alternative embodiments, each cell 82 may directly output unit current (e.g., without the use of the one or more capacitors) to generate the unit powered signal upon activation. For example, the unit power signal generated by each of the cells 82 may have an amplitude based on an amplitude of a supply voltage (e.g., a supply voltage of the power source 26) associated with the cells 82, a voltage gain of the cells 82, a capacitance of the cells 82, or a combination thereof.

The DAC 40 may include decoder circuitry including one or more column decoders and line decoders. In the depicted embodiment, the DAC 40 may include an in-phase column decoder 92 (I column decoder 92) coupled to the cells 82 (e.g., directly to the first group of columns 86 of the cells 82, and via the first group of columns 86 of the cells 82 to the second group of columns 88 of the cells 82). The DAC 40 may also include a quadrature column decoder 94 (Q column decoder 94) coupled to the second group of columns 88 of the cells 82. For example, the I column decoder 92 may couple to a first portion of (e.g., half of) the cells 82 associated with the first group of columns 86 of the array 90. Moreover, the Q column decoder 94 may couple to a second portion of (e.g., a remaining portion of) the cells 82 associated with the second group of columns 88 of the array 90. The DAC 40 may also include an in-phase line decoder 96 (I line decoder 96) and a quadrature line decoder 98 (Q line decoder 98) coupled to the lines 84 of the cells 82. In some cases, the I line decoder 96 and the Q line decoder 98 may each individually or collectively drive one or more of the lines 84 of the cells 82.

The digital signal 56 (e.g., of outgoing data 38) described above in FIGS. 3 and 4 may include in-phase digital code and quadrature digital code. The I column decoder 92 and the I line decoder 96 may be coupled to an in-phase digital code line 100 (I digital code line 100) to receive in-phase digital code (the I digital code). The I digital code may correspond to the I signals of the RF signals for transmission. For example, the processor 12 of FIG. 1, or any other viable circuitry associated with the electronic device 10, may provide the I digital code to the I column decoder 92 and the I line decoder 96 via the I digital code line 100. Moreover, the Q column decoder 94 and the Q line decoder 98 may be coupled to a quadrature digital code line 102 (Q digital code line 102) to receive quadrature digital code (the Q digital code). The Q digital code may correspond to the Q signals of the RF signals. Similarly, the processor 12, or any other viable circuitry associated with the electronic device 10, may provide the Q digital code to the Q column decoder 94 and the Q line decoder 98 via the Q digital code line 102.

The DAC 40 may receive one clock signal to generate and provide the I signals and the Q signals. In the depicted embodiment, the I column decoder 92, the Q column decoder 94, the I line decoder 96, and the Q line decoder 98 may be coupled to a clock signal 104 to receive the clock signal. For example, a clock circuit of the electronic device 10 may provide the clock signal via the clock signal line 104.

The I column decoder 92 and the I line decoder 96 may activate (e.g., switch on) a number of the cells 82 of the first group of columns 86 based on receiving the clock signal from the clock signal 104 and upon receiving the I digital code from the I digital code line 100. The activated cells 82 of the first group of columns 86 may generate a number of unit power signals for generating the I signals based on the clock signal. Similarly, the Q column decoder 94 and the Q line decoder 98 may activate a number of the cells 82 of the second group of columns 88 based on receiving the clock signal from the clock signal 104 and upon receiving the Q digital code from the Q digital code line 102. The activated cells 82 of the second group of columns 88 may generate a number of unit power signals for generating the Q signals based on the clock signal. Accordingly, the activated cells 82 of the first group of columns 86 and the second group of columns 88 may generate the unit power signals for generating the I signals and the Q signals in-phase based on the single clock signal.

In some cases, an aggregate capacitance value of the cells 82 may correspond to an operating frequency of the DAC 40 for providing the RF signals. For example, increasing the operating frequency of the DAC 40 may decrease an aggregate capacitance value of the cells 82 of the first group of columns 86 for providing the I signals. Similarly, increasing the operating frequency of the DAC 40 may decrease an aggregate capacitance value of the cells 82 of the second group of columns 88 for providing the Q signals. Moreover, as mentioned above, the first portion of the cells 82 associated with the first group of columns 86 may generate unit power signals for generating the I signals of the RF signals. Furthermore, the second portion of the cells 82 associated with the second group of columns 88 may generate the Q signals of the RF signals. Accordingly, each cell 82 of the array 90 may output unit current (if activated), where the current may be scaled as desired. In additional or alternative embodiments, each cell 82 of the array 90 may include one or more capacitors with higher capacitance values based on a split number of the cells 82 associated with the first group of columns 86 and the second group of columns 88.

The DAC 40 may also include a first matching circuit 106 coupled to the first group of columns 86 of the cells 82 and a second matching circuit 108 coupled to the second group of columns 88 of the cells 82. In some embodiments, the first matching circuit 106 and the second matching circuit 108 may receive combined unit power signals (e.g., the I signals and the Q signals). In alternative or additional embodiments, the first matching circuit 106 may receive unit power signals generated by the activated cells 82 of the first group of columns 86. Similarly, the second matching circuit 108 may receive unit power signals generated by the activated cells 82 of the second group of columns 88. In such embodiments, the first matching circuit 106 may combine (e.g., aggregate) the received unit power signals (e.g., from at least the activated cells 82 of the first group of columns 86) to provide the I signals. Moreover, the second matching circuit 108 may also combine (e.g., aggregate) the received unit power signals (e.g., from at least the activated cells 82 of the second group of columns 88) to provide the Q signals.

In any case, the first matching circuit 106 and the second matching circuit 108 may have an output impedance for providing the I signals and the Q signals. Moreover, the first matching circuit 106 and the second matching circuit 108 may provide the I signals and the Q signals in-phase (e.g., substantially in-phase) based on the single clock signal.

The 90 degree hybrid coupler 80, hereinafter coupler 80, may couple to outputs of the first matching circuit 106 and the second matching circuit 108 to receive the I signals in-phase with the Q signals. For example, a first input port 110 of the coupler 80 may be coupled to an output of the first matching circuit 106 to receive the I signals. Moreover, a second input port 112 of the coupler 80 may be coupled to an output of the second matching circuit 108 to receive the Q signals. As such, the coupler 80 may delay the Q signals by 90 degrees (e.g., near 90 degrees) for providing the RF signals. In alternative or additional embodiments, the coupler 80 may delay the Q signals by a different degree for providing the RF signals. Moreover, in some embodiments, the coupler 80 may delay the I signals by any suitable phase, while not delaying the Q signals. Accordingly, the coupler 80 may provide the RF signals including quadrature signals (the I signals and the Q signals with 90 degrees phase difference) to an output port 114 for transmission via the antennas 34A-34N.

In the depicted embodiment, an impedance matching port 116 of the coupler 80 is coupled to an impedance or impedance device 118. The impedance 118 may provide at least a portion of an output impedance of the output port 114 of the coupler 80 and therefore the DAC 40, and at least in some embodiments, may include a resistor. For example, an impedance or resistance value of the impedance 118 may correspond to the output impedance of the coupler 80. Accordingly, the output impedance of the DAC (or the output port 114) may be tunable by adjusting the impedance or resistance value of the impedance 118. In some embodiments, the impedance 118 may provide a variable impedance or resistance (e.g., as adjusted, in real-time, by the processor 12). For example, the processor 12 may vary impedance or resistance to tune imaginary parts of the impedance at at least some ports to better balance the I and Q signals. Moreover, as mentioned above, the first matching circuit 106 and the second matching circuit 108 may have an output impedance for providing the I signals and the Q signals. Accordingly, in some cases, the coupler and the first matching circuit 106 and the second matching circuit 108 may provide a granular, two-step, impedance matching process between the array 90 and other circuitry (e.g., the modulator 42, the power amplifier 46, the antennas 34A-34N) coupled to an output of the DAC 40 (e.g., the output port 114).

In such cases, the first matching circuit 106, the second matching circuit 108, and the coupler 80 may each partially convert the output impedance of the DAC 40 for providing the I signals and the Q signals of the RF signals, respectively. For example, the cells 82 of the array 90 may provide the unit power signals (or the I signals and the Q signals) with a first output impedance (e.g., 1Ω or less, 2Ω or less, 5Ω or less, 5Ω or more, and so on). Moreover, the first matching circuit 106 and the second matching circuit 108 may provide the I signals and the Q signals with a second output impedance (e.g., 10Ω or less, 10Ω or more, 12Ω or more, 15Ω or more, 20Ω or more, 25Ω or more, 30Ω or more, and so on) higher than the first output impedance. Furthermore, the coupler 80 may provide the RF signals, including the I signals and the Q signals, with a third output impedance (e.g., 45Ω or less, 50Ω or less, 55Ω or less, 55Ω or more, and so on) based on the impedance or resistance value of the impedance 118 (e.g., from 5Ω to 50Ω, from 45Ω to 100Ω, and so on). The two-step impedance matching may reduce reflections of the RF signals based on reducing disturbance of the imaginary part of the output impedance.

Figure 7:
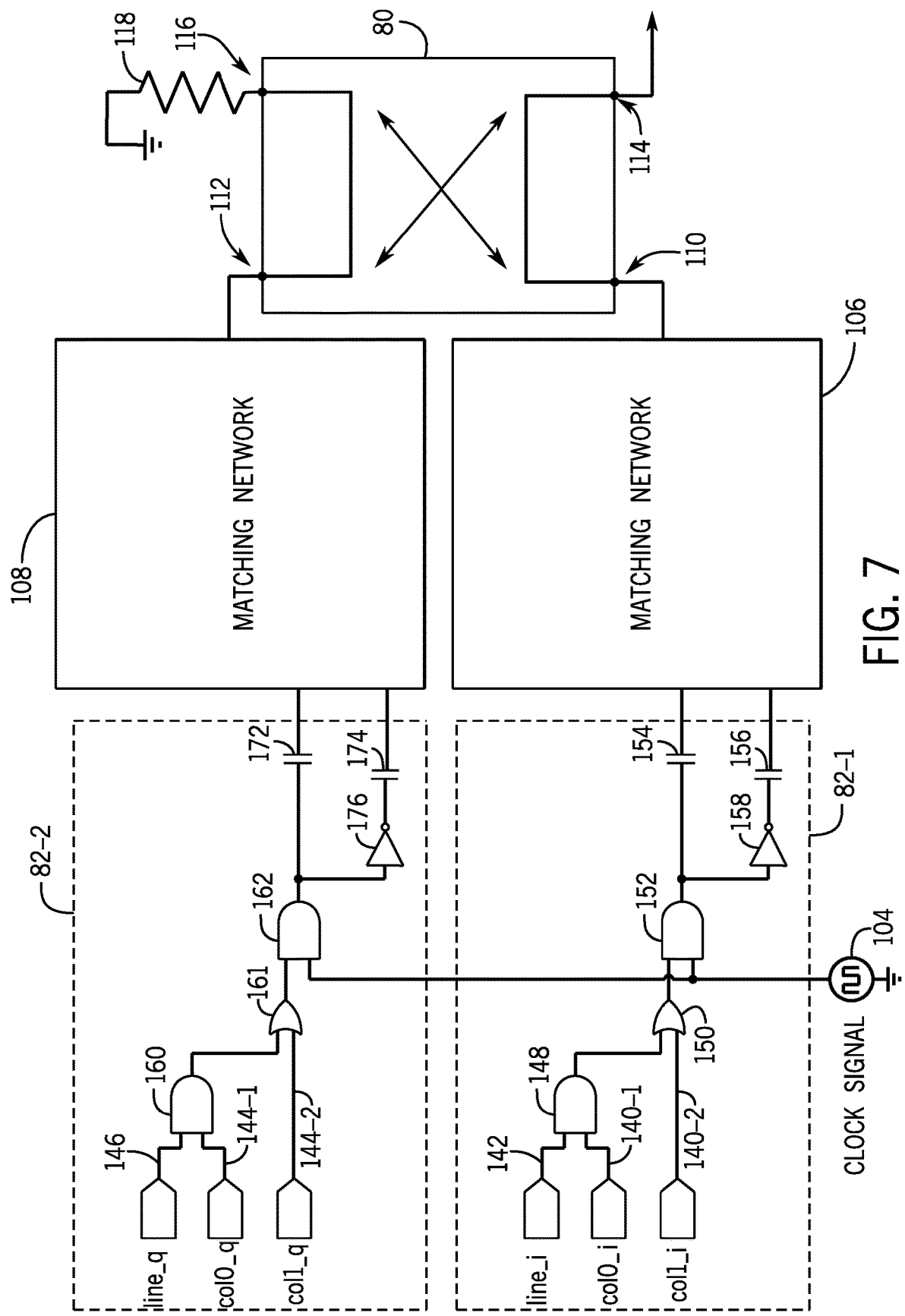
FIG. 7 is an exemplary circuit diagram of a portion of the DAC in FIG. 6 depicting a first cell associated with generating in-phase components of an analog signal and a second cell associated with generating quadrature components of the analog signal, in accordance with an embodiment of the present disclosure.

FIG. 7 depicts an exemplary circuit diagram of a first cell 82-1 and a second cell 82-2 of the array 90 (shown in FIG. 6) of the DAC 40. It should be understood that the exemplary circuit diagram of FIG. 7 is provided as an example, and it is contemplated that there are other suitable circuit diagrams (e.g., including more or less components than those illustrated) that serve to perform the same or similar tasks. The first cell 82-1 and the second cell 82-2 are provided as examples. As such, it should be appreciated that in different embodiments, the first cell 82-1 and the second cell 82-2 may have different circuitry. The first cell 82-1 may be associated with the first group of columns 86 of the array 90 and the second cell 82-2 may be associated with the second group of columns 88 of the array 90. The DAC 40 may include a number of (e.g., 128 or less, 256 or less, 512 or less, 512 or more, and so on) cells 82 similar to (or different in other embodiments) to the first cell 82-1 and the second cell 82-2.

The first cell 82-1 may be coupled to the I column decoder 92 and the I line decoder 96 (shown in FIG. 6). The first cell 82-1 may receive one or more activation signals (e.g., 140-1, 140-2) from the I column decoder 96 and one or more activation signals (e.g., 142) from the I line decoder 96. For example, as illustrated, a first activation signal 140-1 from the I column decoder 96 may correspond to a first column (e.g., col0_i) of the DAC 40 that generates I signals, and a second activation signal 140-2 from the I column decoder 96 may correspond to a second column (e.g., col1_i) of the DAC 40 that generates I signals. Moreover, the second cell 82-2 may be coupled to the Q column decoder 94 and the Q line decoder 98 (shown in FIG. 6). As such, the second cell 82-2 may receive one or more activation signals (e.g., 144-1, 144-2) from the Q column decoder 94 and one or more activation signals (e.g., 146) from the Q line decoder 98. For example, as illustrated, a first activation signal 144-1 from the Q column decoder 94 may correspond to a first column (e.g., col0_q) of the DAC 40 that generates Q signals, and a second activation signal 144-2 from the Q column decoder 94 may correspond to a second column (e.g., col1_q) of the DAC 40 that generates Q signals. In any case, the first cell 82-1 and the second cell 82-2 may be coupled to the clock signal 104. Accordingly, the first cell 82-1 and the second cell 82-2 may receive a clock signal (e.g., the single clock signal received by the DAC 40) from the clock signal 104.

In different embodiments, the first cell 82-1 and the second cell 82-2 may include circuitry to generate single-ended or differential analog signals (e.g., unit power signals). In the depicted embodiment, the first cell 82-1 and the second cell 82-2 may include circuitry to generate differential unit power signals. For example, the first cell 82-1 may include a first AND gate 148 that performs an AND operation on the first activation signal 140-1 from the I column decoder 96 and an activation signal 142 from the I line decoder 96. In some cases, the activation signals 140-1, 140-2, 142, and so on, may have a voltage amplitude above a threshold provided over a period of time associated with providing the I signals. An OR gate 150 may receive the result from the AND operation of the first AND gate 148, and perform an OR operation on the result and the second activation signal 140-2 from the I column decoder 96. A second AND gate 152 may receive the result from the OR operation of the OR gate 150, and perform an AND operation on the result and the clock signal 104. As such, the second AND gate 152 may output the clock signal 104 upon receiving the first activation signal 140-1 from the I column decoder 96 and the activation signal 142 from the I line decoder 96, or the second activation signal 140-2 from the I column decoder 96. The second AND gate 152 may drive a first capacitor 154 and a second capacitor 156 (via an inverter 158). As such, the first cell 82-1 may be activated depending on a combination of the signals coming from the I column decoder 96 (e.g., 140-1, 140-2) and the signal coming from the I line decoder 96 (e.g., 142).

The first capacitor 154 may provide a first output and the second capacitor 156 may provide a second output to generate the differential unit power signal. As mentioned above, in some embodiments, the array 90 (shown in FIG. 6) may include circuitry to combine (e.g., aggregate) unit power signals output from other activated cells 82 of the first group of columns 86 (shown in FIG. 6) and the depicted first cell 82-1 to provide the I signals to the first matching circuit 106. Alternatively, the first matching circuit 106 may receive and combine (e.g., aggregate) unit power signals output from the other activated cells 82 of the first group of columns 86 and the depicted first cell 82-1.

Similarly, the second cell 82-2 may include a first AND gate 160 that performs an AND operation on the first activation signal 144-1 from the Q column decoder 94 and an activation signal 146 from the Q line decoder 98. In some cases, the activation signals 144-1, 144-2, 146, and so on, may have a voltage amplitude above a threshold provided over a period of time associated with providing the Q signals. An OR gate 161 may receive the result from the AND operation of the first AND gate 160, and perform an OR operation on the result and the second activation signal 144-2 from the Q column decoder 94. A second AND gate 162 may receive the result from the OR operation of the OR gate 161, and perform an AND operation on the result and the clock signal 104. As such, the second AND gate 162 may output the clock signal 104 upon receiving the first activation signal 144-1 from the Q column decoder 94 and the activation signal 146 from the Q line decoder 98, or the second activation signal 144-2 from the Q column decoder 94. The second AND gate 162 may drive a first capacitor 172 and a second capacitor 174 (via an inverter 176). As such, the second cell 82-2 may be activated depending on a combination of the signals coming from the Q column decoder 94 (e.g., 144-1, 144-2) and the signal coming from the Q line decoder 98 (e.g., 146).

The first capacitor 172 may provide a first output and the second capacitor 174 may provide a second combined output to generate the differential unit power signal. As mentioned above, in some embodiments, the array 90 (shown in FIG. 6) may include circuitry to combine (e.g., aggregate) unit power signals output from other activated cells 82 of the second group of columns 88 (shown in FIG. 6) and the depicted second cell 82-2 to provide the Q signals to the second matching circuit 108. Alternatively, the second matching circuit 108 may receive and combine (e.g., aggregate) unit power signals output from the other activated cells 82 of the second group of columns 88 and the depicted second cell 82-2.

Figure 8:
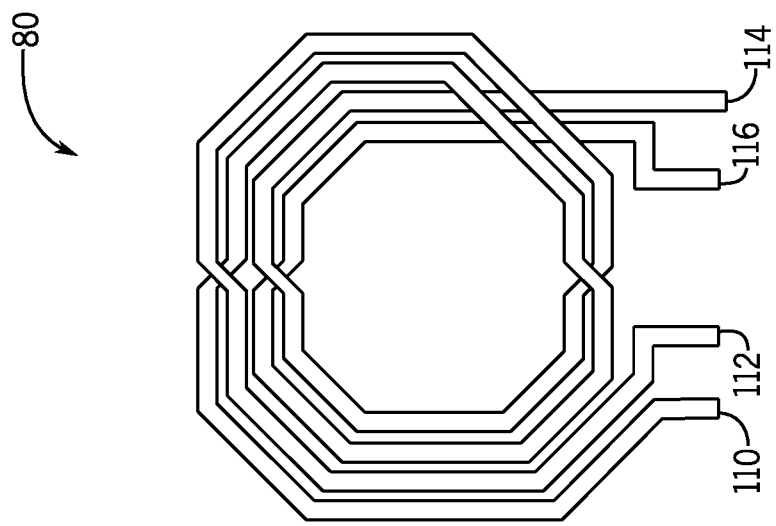
FIG. 8 is an exemplary schematic diagram of an implementation of the hybrid coupler of FIGS. 6 and 7, in accordance with an embodiment of the present disclosure.

FIG. 8 depicts an example implementation of the coupler 80 of the DAC 40. It should be understood that the example implementation of FIG. 8 is provided as an example, and it is contemplated that there are other suitable implementations (e.g., including more or less components than those illustrated) that serve to perform the same or similar tasks. The coupler 80 may include the first input port 110, the second input port 112, the impedance matching port 116, and the output port 114. For example, the coupler 80 may provide a phase delay (e.g., 90 degrees phase delay) to input signals received via the second input port 112 (e.g., the Q signals). In the depicted embodiment, the coupler 80 includes mutually coupled coils formed by multiple hexagonal conductors. In alternative or additional embodiments, the coupler 80 may include mutually coupled coils formed by any other viable shape (e.g., various circular shapes, various rectangular shapes, and so on). Moreover, the ports of the coupler 80 may have various configurations. In different cases, the ports of the coupler 80 may be positioned equidistant from one another, on a top half of a circular shape, split equally on opposite sides of a rectangular shape, at ends of two parallel lines, among other positions.

In any case, a size of the coils and therefore the coupler 80 is determined based on the operating frequency of the DAC 40. For example, the size of the coupler 80 may decrease in high frequency applications such as millimeter wave (mm wave) frequency range applications. In specific embodiments, the DAC 40 may include the coupler 80 based on an overall size of the electronic device 10 and/or the DAC 40 and the operating frequency of the DAC 40 for providing the RF signals. In alternative or additional embodiments, the electronic device 10 may include the coupler 80 coupled to the outputs of the DAC.

Moreover, the coupler 80 may provide inductances based on the shape and size of the coils to provide the RF signals. In some cases, one or more of the ports of the coupler 80 may couple to one or more capacitors. For example, a capacitance value of the capacitors may be based at least in part on an operating frequency of the DAC 40. Moreover, as mentioned above, an impedance 118 may be coupled to the impedance matching port 116 for tuning the output impedance of the coupler 80.

Figure 9:
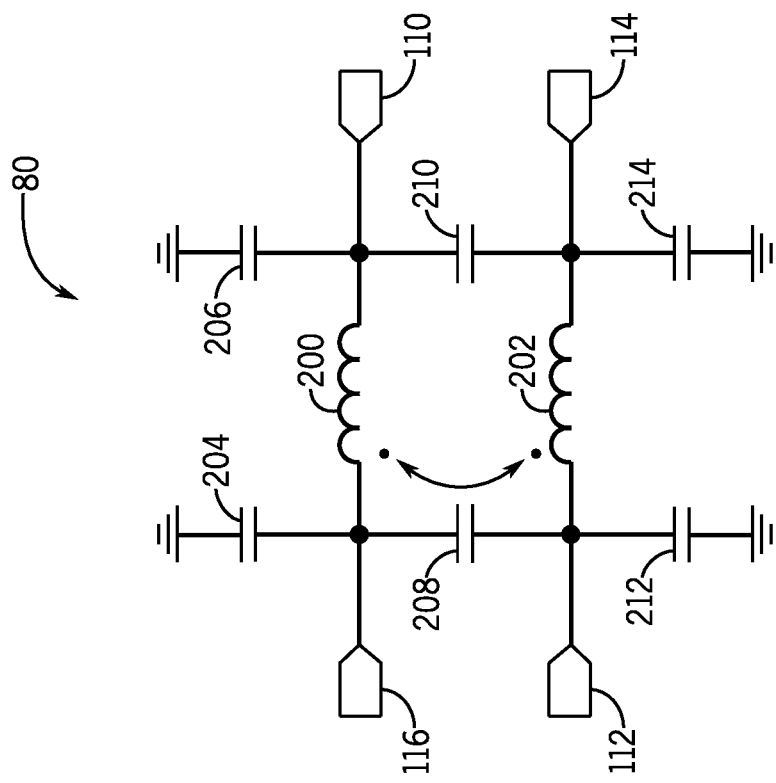
FIG. 9 is a lumped equivalent circuit diagram associated with the hybrid coupler of FIG. 8, in accordance with an embodiment of the present disclosure.

With the foregoing in mind, FIG. 9 depicts a lumped equivalent circuit diagram associated with the coupler 80 of the DAC 40. In the depicted embodiment, the coupler 80 may include a first inductor 200, a second inductor 202, a first capacitor 204, a second capacitor 206, a third capacitor 208, a fourth capacitor 210, a fifth capacitor 212, and a sixth capacitor 214. It should be appreciated that the coupler 80 in FIG. 9 is provided by the way of example and, in other embodiments, the coupler 80 may have different circuitry. A coil of the coupler 80 (shown in FIG. 8) may provide inductances equivalent to the first inductor 200 and the second inductor 202.

In specific cases, the coil of the coupler 80 may provide capacitances equivalent to one or more of the first capacitor 204, the second capacitor 206, the third capacitor 208, the fourth capacitor 210, the fifth capacitor 212, and/or the sixth capacitor 214. Additionally or alternatively, one or more capacitors may be coupled to various parts of the coil of the coupler 80 to provide a capacitance of one or more of the first capacitor 204, the second capacitor 206, the third capacitor 208, the fourth capacitor 210, the fifth capacitor 212, and/or the sixth capacitor 214. In yet different embodiments, one or more of the capacitors 204, 206, 208, 210, 212, and/or 214 may be removed.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A digital-to-analog converter (DAC) comprising:
    a first cell;
    a second cell;
    a clock signal line;
    an in-phase digital code line;
    a quadrature digital code line;
    decoder circuitry coupled to the first cell, the second cell, the clock signal line, and the in-phase digital code line;
    a first matching circuit coupled to the first cell;
    a second matching circuit coupled to the second cell; and
    a hybrid coupler coupled to the first matching circuit and the second matching circuit.

2. The DAC of claim 1, wherein the first cell and the second cell are each a unit power amplifier.

3. The DAC of claim 1, wherein the clock signal line is configured to receive a clock signal, the in-phase digital code line is configured to receive an in-phase digital code, and the decoder circuitry is configured to activate the first cell based on the clock signal line and the in-phase digital code line.

4. The DAC of claim 3, wherein the first cell is configured to output a first output signal having a first phase when activated.

5. The DAC of claim 4, wherein the quadrature digital code line is configured to receive a quadrature digital code, and the decoder circuitry is configured to activate the second cell based on the clock signal and the quadrature digital code, wherein the second cell is configured to output a second output signal having the first phase when activated.

6. The DAC of claim 5, wherein the hybrid coupler is configured to
receive the first output signal having the first phase,
output the first output signal having the first phase,
receive the second output signal having the first phase,
delay the second output signal to generate a delayed second output signal having a second phase; and
output the delayed second output signal.

7. The DAC of claim 1, wherein the decoder circuitry comprises a first column decoder coupled to the first cell and a second column decoder coupled to the second cell.

8. The DAC of claim 1, wherein the decoder circuitry comprises a line decoder coupled to the first cell and the second cell.

9. A transmitter comprising:
a power amplifier; and
a digital-to-analog converter (DAC) coupled to the power amplifier, the DAC comprising
a clock signal line,
an in-phase digital code line,
a quadrature digital code line,
a first column decoder coupled to the clock signal line, the in-phase digital code line, and a first cell, the first cell configured to output a first output signal,
a second column decoder coupled to the clock signal line, the quadrature digital code line, and a second cell, the second cell configured to output a second output signal,
a line decoder coupled to the clock signal line, the quadrature digital code line, the first cell, and the second cell, and
a hybrid coupler configured to
receive the first output signal and the second output signal, and
output a quadrature analog signal to the power amplifier based on the first output signal and the second output signal.

10. The transmitter of claim 9, wherein the DAC comprises a first matching circuit coupled to the first cell and the hybrid coupler and a second matching circuit coupled to the second cell and the hybrid coupler.

11. The transmitter of claim 9, wherein the hybrid coupler comprises one or more coils.

12. The transmitter of claim 9, wherein
the first column decoder and the line decoder are configured to activate the first cell, the first cell being configured to output the first output signal having a first phase when activated, and
the second column decoder and the line decoder are configured to activate the second cell, the second cell being configured to output the second output signal having the first phase when activated.

13. The transmitter of claim 12, wherein the hybrid coupler is configured to
receive the first output signal having the first phase,
receive the second output signal having the first phase, and
delay the second output signal to generate a delayed second output signal having a second phase, the quadrature analog signal comprising the first output signal having the first phase and the delayed second output signal having the second phase.

14. The transmitter of claim 13, wherein the second phase is 90 degrees greater than the first phase.

15. An electronic device comprising:
one or more antennas;
a memory storing digital codes;
a processor configured to provide the digital codes retrieved from the memory based on receiving an indication to transmit data; and
a digital-to-analog converter (DAC) comprising a hybrid coupler, the DAC configured to receive the digital codes from the processor, the hybrid coupler configured to
receive a first signal having a first phase based on the digital codes,
output the first signal having the first phase for transmission by the one or more antennas,
receive a second signal having the first phase based on the digital codes,
delay the second signal to generate a delayed second signal having a second phase, and
output the delayed second signal for transmission by the one or more antennas.

16. The electronic device of claim 15, wherein the digital codes comprises in-phase digital codes indicative of in-phase signals of one or more radio frequency signals and quadrature digital codes indicative of quadrature signals of the one or more radio frequency signals.

17. The electronic device of claim 15, wherein the DAC is configured to generate the first signal and the second signal with a frequency higher than 25 gigahertz.

18. The electronic device of claim 15, wherein the first signal comprises a first aggregation of a first plurality of unit power signals and the second signal comprises a second aggregation of a second plurality of unit power signals.

19. The electronic device of claim 18, wherein the DAC comprises a first column decoder, a second column decoder, a line decoder, and an array of unit power amplifiers, wherein a first portion of the array of unit power amplifiers is coupled to the first column decoder and the line decoder and a second portion of the array of unit power amplifiers is coupled to the second column decoder and the line decoder.

20. The electronic device of claim 19, wherein the first portion of the array of unit power amplifiers is configured to generate the first plurality of unit power signals and the second portion of the array of unit power amplifiers is configured to generate the second plurality of unit power signals.

* * * * *